United States Patent
Abe et al.

(10) Patent No.: US 8,574,464 B2
(45) Date of Patent: Nov. 5, 2013

(54) OXIDE EVAPORATION MATERIAL, TRANSPARENT CONDUCTING FILM, AND SOLAR CELL

(75) Inventors: Yoshiyuki Abe, Tokyo (JP); Riichiro Wake, Tokyo (JP); Masakazu Kuwahara, Tokyo (JP); Kentaro Sogabe, Tokyo (JP); Azusa Oshiro, Tokyo (JP); Hisaki Yada, Tokyo (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 525 days.

(21) Appl. No.: 12/916,952

(22) Filed: Nov. 1, 2010

(65) Prior Publication Data

US 2011/0126899 A1 Jun. 2, 2011

(30) Foreign Application Priority Data

Nov. 30, 2009 (JP) ................................. 2009-271447
Jan. 28, 2010 (JP) ................................. 2010-016289

(51) Int. Cl.
*H01B 1/08* (2006.01)

(52) U.S. Cl.
USPC .................................. 252/518.1; 423/593.1

(58) Field of Classification Search
USPC .................. 252/518.1, 519.1; 423/593.1, 624
See application file for complete search history.

(56) References Cited

U.S. PATENT DOCUMENTS

| | | | |
|---|---|---|---|
| 2007/0209928 A1* | 9/2007 | Inoue et al. | 204/192.15 |
| 2009/0250683 A1* | 10/2009 | Totani et al. | 257/13 |
| 2011/0126899 A1* | 6/2011 | Abe et al. | 136/256 |
| 2012/0175569 A1* | 7/2012 | Nakayama et al. | 252/520.2 |

FOREIGN PATENT DOCUMENTS

| | | |
|---|---|---|
| EP | 0 733 931 | 9/1996 |
| EP | 1 731 629 | 12/2006 |
| EP | 2 168 933 | 3/2010 |
| JP | 8-104978 | 4/1996 |
| JP | 3445891 | 6/2003 |
| JP | 2004-43851 A1 | 2/2004 |
| JP | 2005-243187 A * | 9/2005 |
| JP | 2005-290458 A1 | 10/2005 |
| WO | WO 2009/008297 | 1/2009 |

OTHER PUBLICATIONS

Extended European Search Report in EP 1018974.0 mailed May 9, 2011 (11 pages).

(Continued)

*Primary Examiner* — Mark Kopec
(74) *Attorney, Agent, or Firm* — Kratz, Quintos & Hanson, LLP

(57) ABSTRACT

An oxide evaporation material according to the present invention includes a sintered body containing indium oxide as a main component thereof and cerium with a Ce/In atomic ratio of 0.001 to 0.110. The L* value in the CIE 1976 color space is 62 to 95. The oxide evaporation material with the L* value of 62 to 95 has an optimal oxygen amount. Accordingly, even when a small amount of an oxygen gas is introduced into a film-formation vacuum chamber, a transparent conducting film having a low resistance and a high transmittance in the visible to near-infrared region is formed by vacuum deposition methods. Since the amount of the oxygen gas introduced is small, the difference in composition between the film and the evaporation material is made small. This reduces the variations in composition and characteristics among films formed in large quantities.

4 Claims, 1 Drawing Sheet

(56) References Cited

OTHER PUBLICATIONS

M. Tanaka, et al.; "Application of the Ion Plating Process Utilized High Stable Plasma to the Deposition Technology;" Journal of the Vacuum Society of Japan; vol. 44; No. 4; 2001; pp. 435-439, cover sheets and end sheet (8 sheets total.)/p. 4 of specification.

"Technology of transparent conductive film;" Ohmsha, Ltd.; 1999; pp. 205-211, cover sheet and end sheet (7 sheets total)/p. 5 of specification.

* cited by examiner

SOLAR RAY

SOLAR RAY

SOLAR RAY

OXIDE EVAPORATION MATERIAL, TRANSPARENT CONDUCTING FILM, AND SOLAR CELL

BACKGROUND OF THE INVENTION

1. Field of the Invention

This invention relates to: an oxide evaporation material used when a transparent conducting film is formed by any of various vacuum deposition methods such as electron beam deposition, ion plating, and high-density plasma-assist evaporation; a transparent conducting film formed using the oxide evaporation material; and a solar cell using the transparent conducting film as an electrode. Particularly, the invention relates to an improvement in an oxide evaporation material for forming a high-quality transparent conducting film which is useful as a transparent electrode of a solar cell, has a low resistance, and exhibits a high transmittance in the visible to near-infrared region.

2. Description of the Related Art

A transparent conducting film has a high conductivity and a high transmittance in the visible region. By taking advantage of these characteristics, the transparent conducting film is utilized as an electrode or the like of solar cells, liquid crystal display elements, and various other light receiving elements. Furthermore, by taking advantage of the reflection and absorption characteristics in the near-infrared region, the transparent conducting film is utilized also as: a heat-ray reflection film used for window glasses of automobiles, architectures, and the like; a variety of antistatic films; and an anti-fogging transparent heater for refrigerated showcases or the like.

Generally, the widely used transparent conducting films are formed of: tin oxide ($SnO_2$) containing antimony or fluorine as a dopant; zinc oxide (ZnO) containing aluminum, gallium, indium, or tin as a dopant; indium oxide ($In_2O_3$) containing tin, tungsten, or titanium as a dopant; and the like. Particularly, an indium oxide film containing tin as a dopant, i.e., an $In_2O_3$—Sn film is referred to as an indium tin oxide (ITO) film, and is industrially widely used to date because a low-resistance transparent conducting film is easily obtained.

As to a method for forming such transparent conducting films, generally used are vacuum deposition methods, sputtering methods, and methods involving application of a coating for forming a transparent conducting layer. Above all, the vacuum deposition methods and the sputtering methods are effective methods for a case where a material having a low vapor pressure is used or where precise film thickness control is required. Moreover, these methods are very simple in operation and thus industrially useful. As the vacuum deposition methods are compared with the sputtering methods, the vacuum deposition methods are capable of forming a film at a faster rate and thus superior in productivity.

In the vacuum deposition methods, generally, a solid or liquid evaporation source is heated in a vacuum of approximately $10^{-3}$ to $10^{-2}$ Pa and temporarily decomposed to gas molecules or atoms which are then condensed on the surface of a substrate as a thin film again. Among various heating methods for an evaporation source, a resistance heating method (RH method) or an electron-beam heating method (EB method, electron beam deposition) is generally used. A reactive evaporation method is also well known in which a reactive gas such as an $O_2$ gas is introduced into a film-formation chamber (chamber) for deposition.

The electron beam deposition has been historically frequently utilized for depositing an oxide film such as ITO. Specifically, an ITO oxide evaporation material (may also be called an ITO tablet or an ITO pellet) is used as the evaporation source, and an $O_2$ gas serving as the reactive gas is introduced into a film-formation chamber (chamber). Thermal electrons jumped off from a thermal-electron generating filament (mainly a W wire) are accelerated by an electric field and radiated to the ITO oxide evaporation material. The oxide evaporation material is locally heated at the radiated area thereof, and evaporated and deposited to a substrate. Meanwhile, activated reactive evaporation (ARE method) is also a useful method for ITO film formation. In this method, a plasma is generated using a thermal electron emitter or RF discharge, and an evaporation material and a reactive gas ($O_2$ gas, or the like) are activated by this plasma, thereby forming a low-resistance film on a low-temperature substrate. Furthermore, high-density plasma-assist evaporation (HDPE method) using a plasma gun also has been revealed to be an effective method for ITO film formation, and begun to be industrially widely used recently [see "Vacuum," Vol. 44, No. 4, 2001, pp. 435-439 (hereinafter, "Non-Patent Document 1")]. This method utilizes an arc discharge using a plasma generator (plasma gun). The arc discharge is maintained between a cathode inside the plasma gun and a crucible (anode) of an evaporation source. Electrons emitted from the cathode are guided by a magnetic field, concentrated and radiated to a local area of an ITO oxide evaporation material put in the crucible. An evaporant is generated from the area that is locally heated by the radiation of the electron beams, and deposited to a substrate. The vaporized evaporant and an introduced $O_2$ gas are activated in this plasma, so that an ITO film having favorable electrical characteristics can be formed. Meanwhile, as another classification of these various vacuum deposition methods, those involving ionization of an evaporation material and a reactive gas are collectively referred to as ion plating (IP method). Ion plating is effective as a method to obtain an ITO film having a low resistance and a high transmittance [see "Technology of transparent conductive film," Ohrmsha, Ltd., 1999, pp. 205-211 (hereinafter, "Non-Patent Document 2")].

Meanwhile, in any type of solar cell using a transparent conducting film, the transparent conducting film is essential for an electrode on the front side from which light enters the cell. As the transparent conducting film, the aforementioned ITO film or a zinc oxide (ZnO) film doped with aluminum or gallium has been conventionally utilized. These transparent conducting films are required to have such characteristics as a low resistance and a high transmittance of sunlight. As methods for forming these transparent conducting films, the above-described vacuum deposition methods such as ion plating and high-density plasma-assist evaporation are used.

An oxide evaporation material used in the above-described vacuum deposition methods such as electron beam deposition, ion plating, and high-density plasma-assist evaporation is a sintered body small in size (for example, having a diameter of approximately 10 to 50 mm, and a height of approximately 10 to 50 mm). This limits the amount of film that can be formed from a single oxide evaporation material. Moreover, when the remaining amount of oxide evaporation material is decreased as the consumed amount is increased, the following procedure has to be performed: terminating the film formation; introducing air into the film-formation chamber in the vacuum state for replacement with a fresh oxide evaporation material yet to be used; and evacuating the film-formation chamber again. This consequently lowers the productivity.

Essential techniques adopted in mass production of transparent conducting films by the vacuum deposition methods such as electron beam deposition, ion plating, and high-density plasma-assist evaporation include a method of continuously supplying the oxide evaporation materials. Non-Patent Document 1 describes an example of such a continuous supply method. In the continuous supply method, cylindrical oxide evaporation materials are housed in series inside a cylindrical hearth, and are sequentially pushed out and continuously supplied while the height of the sublimation surface is kept the same. The continuous supply method of an oxide evaporation material enables mass production of transparent conducting films by the vacuum deposition methods.

As the oxide evaporation material used as the raw material, Japanese Patent Laid-open Application No. Hei 8-104978 (hereinafter, "Patent Document 1") proposes an ITO-evaporation material which is substantially $In_2O_3$—$SnO_2$ based particles made of indium, tin, and oxygen, having a volume of 0.01 to 0.5 $cm^3$ per particle, a relative density of 55% or more, and a bulk density of 2.5 $g/cm^3$ or lower when filled in a container. Patent Document 1 states that this structure enables manufacturing of an ITO-evaporation material which is capable of stable formation of a low-resistance ITO film by electron beam deposition with a utility efficiency of 80% or more and is continuously suppliable without clogging in a supplying machine.

Meanwhile, as a raw material used in the sputtering methods (i.e., a sputtering target material), various compositions are proposed for an indium oxide-based transparent conducting film other than ITO. For example, Japanese Patent No. 3445891 and Japanese Patent Laid-open Application No. 2005-290458 (hereinafter, respectively "Patent Documents 2 and 3") each propose techniques related to a sputtering target material made of indium oxide containing cerium (In—Ce—O); and a transparent conducting film obtained by sputtering the sputtering target material. Moreover, Patent Document 2 states that, since the indium oxide-based transparent conducting film containing cerium proposed therein poorly reacts with Ag, a transparent conducting film having a high transmittance and excellent heat resistance can be formed when the indium oxide-based transparent conducting film is stacked on a Ag-based ultra-thin film. Patent Document 3 states that a film having excellent etching characteristics is obtained, and so forth. Furthermore, a crystalline transparent conducting film made of indium oxide containing tungsten (crystalline In—W—O) has been recently revealed to be useful as a transparent electrode of a solar cell [see Japanese Patent Laid-open Application No. 2004-43851 (hereinafter, "Patent Document 4")].

These indium oxide-transparent conducting films other than ITO are low in resistance, and excellent in transmittance in the visible region. In addition, in transmittance in the near-infrared region, these indium oxide-transparent conducting films are superior to the above-described conventionally-used ITO film and zinc oxide film. The use of such transparent conducting films as an electrode on the front side of a solar cell enables effective utilization of the energy of the near-infrared light.

However, there are few techniques related to an oxide evaporation material for stably forming the above-described indium oxide-transparent conducting films other than ITO by vacuum deposition methods. Despite of considerably high worldwide demands for solar cells in recent years, there are very few techniques related to: an oxide evaporation material from which a transparent conducting film useful as a transparent electrode of a solar cell is effectively formed by deposition methods; and a deposition film formed therefrom.

For this reason, a technique for producing a sintered body of a sputtering target has been also adopted so far for an oxide evaporation material used in vacuum deposition methods.

However, in the case of forming a transparent conducting film having a low resistance and a high transmittance by any of various vacuum deposition methods such as electron beam deposition, ion plating, and high-density plasma-assist evaporation, using a conventional oxide evaporation material manufactured by the technique adopted so far, a large amount of oxygen gas needs to be introduced into a film-formation vacuum chamber during the film formation. This brings about problems mainly described below.

First, the transparent conducting film and the oxide evaporation material greatly differ in composition from each other, making it difficult to design the composition of the transparent conducting film. This is because, generally, when a larger amount of oxygen is introduced into a film-formation vacuum chamber, the difference in composition between a transparent conducting film and an oxide evaporation material is likely to increase. In the mass production process of films, the amount of oxygen in a film-formation vacuum chamber also tends to vary. Due to the variation in the oxygen amount, the compositions of the films are likely to differ from one another, resulting in the variation of the film characteristics.

Moreover, when the oxygen amount is increased, film formation by reactive evaporation using an oxygen gas causes problems that not only does the film density decrease, but also the adhesive force of the film to the substrate weakens, for example. These problems occur for the following reason. Specifically, when evaporated metal oxide is oxidized before reaching the substrate, the energy is lost. Thus, an increase in the oxidation ratio makes it difficult to obtain a dense film strongly adhering to the substrate.

Furthermore, suppose a case where a transparent conducting film is formed on a substrate covered with a metal film or an organic film having a surface that can be oxidized easily. In this case, if a large amount of oxygen gas is introduced into a film-formation vacuum chamber, the substrate surface is oxidized before film formation. This hinders fabrication of a high-performance device. This tendency becomes more noticeable as the temperature of the substrate during the film formation is higher. In the case of manufacturing a solar cell that receives light from a surface on the side opposite to the substrate and converts the light into energy, for example, a transparent conducting film needs to be formed on a PIN element formed of metal thin films. Accordingly, if a film is formed with a large amount of oxygen introduced, the element is likely to be damaged, hindering fabrication of a high-performance device. The same is true for forming organic thin-film solar cells and top emission-type organic electroluminescent elements. When a transparent conducting film is formed on an organic light-emitting layer, the organic light-emitting layer is oxidized and thus damaged under a condition where a large amount of oxygen is introduced. Hence, a high-performance element cannot be formed.

SUMMARY OF THE INVENTION

The present invention has been made by focusing on such problems. What it aims is to provide an oxide evaporation material mainly containing indium oxide to which at least cerium is added, the oxide evaporation material enabling stable formation of a transparent conducting film having a low resistance and a high transmittance not only in the visible region but also in the near-infrared region, even when a small amount of oxygen is introduced during the film formation. Together provided are a transparent conducting film formed by using the oxide evaporation material and a solar cell using the transparent conducting film as an electrode.

Specifically, an oxide evaporation material according to the present invention comprises a sintered body containing: indium oxide as a main component thereof; and cerium, wherein a cerium content is 0.001 to 0.110 in a Ce/In atomic ratio, and an L* value in a CIE 1976 color space is 62 to 95.

A transparent conducting film according to the present invention comprises: a crystalline transparent conducting film formed by electron beam deposition, ion plating, or high-density plasma-assist evaporation, using the oxide evaporation material comprising a sintered body containing: indium oxide as a main component thereof; and cerium, the oxide evaporation material having a cerium content of 0.001 to 0.110 in a Ce/In atomic ratio and an L* value of 62 to 95 in a CIE 1976 color space, wherein the cerium content is 0.001 to 0.110 in the Ce/In atomic ratio.

A solar cell according to the present invention comprises an electrode formed of the crystalline transparent conducting film having a cerium content of 0.001 to 0.110 in a Ce/In atomic ratio.

The oxide evaporation material according to the present invention with the L* value in the CIE 1976 color space of 62 to 95 has an optimal oxygen amount. Accordingly, the use of this oxide evaporation material enables formation by vacuum deposition methods of a transparent conducting film having a low resistance and a high transmittance in the visible to near-infrared region, even when a small amount of an oxygen gas is introduced into a film-formation vacuum chamber. Moreover, since the amount of the oxygen gas introduced into the film-formation vacuum chamber is small, the difference in composition between the film and the oxide evaporation material is made small. This not only facilitates formation of a targeted film composition, but also reduces the variations in the compositions and the characteristics of films formed in large quantities. Furthermore, since the amount of an oxygen gas introduced into the film-formation vacuum chamber is small in the film formation, damage to the substrate by the oxygen gas is reduced. Accordingly, a high-performance device is obtained. Particularly, high-performance films useful for solar cells can be stably formed without damaging the substrate.

In addition, the use of the oxide evaporation material according to the present invention enables formation by vacuum deposition methods of a transparent conducting film exhibiting a high conductivity and a high transmittance not only in the visible region but also in the near-infrared region.

DESCRIPTION OF THE PREFERRED EMBODIMENTS

Figure 1:
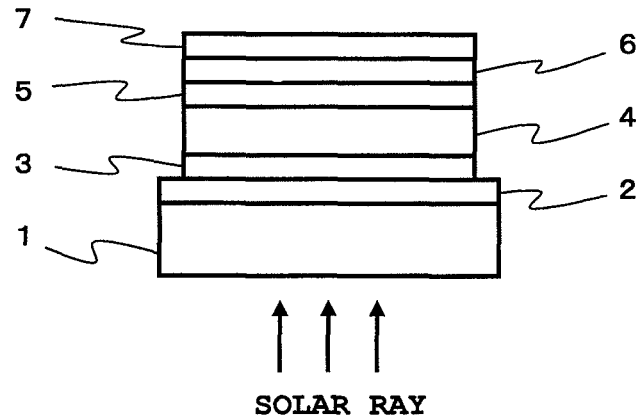
FIG. 1 is an explanatory drawing showing a schematic structure of a silicon-based solar cell using a transparent conducting film according to the present invention as an electrode layer.

Embodiments of the present invention are described below in detail.

(1) Oxide Evaporation Material

An oxide evaporation material of the present invention has a composition containing indium oxide as a main component thereof and cerium with the Ce/In atomic ratio of 0.001 to 0.110. A transparent conducting film formed by a vacuum deposition method using the oxide evaporation material of the present invention has a composition very similar to the composition of the oxide evaporation material. Thus, the composition of a film to be formed also contains indium oxide as a main component thereof and cerium with the ratio of 0.001 to 0.110. The reason that cerium is contained in the aforementioned ratio is that the cerium in the ratio can increase the mobility in the indium oxide film. If the cerium content (Ce/In atomic ratio) in the film composition, i.e., the composition of the oxide evaporation material, is lower than 0.001, the effect of increasing the mobility is small, and a low-resistance film cannot be obtained. Meanwhile, if the cerium content exceeds 0.110, the film contains cerium excessively. In this case, the neutral impurity scattering in movement of electrons is increased, and the mobility is decreased. Thus, a low-resistance film cannot be obtained. A more preferable cerium content to obtain a low-resistance film exhibiting a higher mobility is 0.004 to 0.051 in the Ce/In atomic ratio.

Moreover, when the oxide evaporation material of the present invention contains tungsten as an additive element in addition to cerium, a low-resistance film exhibiting a high mobility can be obtained. In this case, the optimal amount of tungsten to be added is preferably 0.001 to 0.020 in a W/In atomic ratio with the proviso that cerium is contained in the Ce/In atomic ratio of 0.004 to 0.051. In a case where cerium is contained in the aforementioned ratio of 0.004 to 0.051, if the tungsten-content ratio is lower than 0.001, the effect of adding tungsten is small. Meanwhile, the tungsten-content ratio exceeding 0.020 is not preferable. This is because, with such a content ratio, the neutral impurity scattering in movement of electrons in the film is increased, thereby decreasing the mobility; thus, a low-resistance film cannot be obtained.

Furthermore, when the oxide evaporation material of the present invention contains molybdenum as an additive element in addition to cerium, a low-resistance film exhibiting a high mobility can also be obtained. In this case, the optimal amount of molybdenum to be added is preferably 0.001 to 0.050 in a Mo/In atomic ratio with the proviso that cerium is contained in the Ce/In atomic ratio of 0.004 to 0.051. In a case where cerium is contained in the aforementioned ratio of 0.004 to 0.051, if the molybdenum-content ratio is lower than 0.001, the effect of adding molybdenum is small. Meanwhile, the molybdenum-content ratio exceeding 0.050 is not preferable. This is because, with such a content ratio, the neutral impurity scattering in movement of electrons in the film is increased, thereby decreasing the mobility; thus, a low-resistance film cannot be obtained.

Incidentally, the transparent conducting film containing indium oxide as the main component is an n-type semiconductor. To exhibit a high conductivity and a high transmittance, the transparent conducting film needs appropriate oxygen deficiency. Specifically, in a case where the amount of oxygen in the film is large but the amount of oxygen deficiency is small, even if a dopant is contained, the film does not exhibit conductivity. To exhibit conductivity, oxygen deficiency needs to be introduced into the film. However, if the amount of oxygen deficiency is too large, visible light is absorbed in a large amount, which may cause unintended coloration. Thus, the film needs to have an optimal oxygen deficiency. Oxygen in the film is supplied from the oxide evaporation material serving as the raw material thereof. Additionally, oxygen is supplied from an oxygen gas which is introduced into a film-formation vacuum chamber during the film formation and then incorporated into the film. When a smaller amount of oxygen is supplied from the oxide evaporation material, a larger amount of oxygen gas needs to be introduced into the film-formation vacuum chamber. Nevertheless, if a large amount of oxygen gas is introduced into the film-formation vacuum chamber, the above-described problems occur. Thus, an oxide evaporation material having an optimal oxygen amount is useful.

The most distinguishing characteristic of the oxide evaporation material according to the present invention is that the oxide evaporation material is specified by an L* value in a CIE 1976 color space. Herein, the CIE 1976 color space is a color space endorsed by the international commission on illumination (CIE) in 1976, and represents a color by coordinates in the uniform color space with lightness L* and chromatic indexes a* and b*. The CIE 1976 color space is also abbreviated as the CIELAB. The L* value represents lightness: L*=0 indicates black, while L*=100 indicates diffuse white. Moreover, a negative value of a* indicates a color approximate to green, while a positive value thereof indicates a color approximate to magenta. A negative value of b* indicates a color approximate to blue, while a positive value thereof indicates a color approximate to yellow.

The colors of the surface and the inside of a sintered body of the oxide evaporation material according to the present invention are preferably the same when specified by an L* value in the CIE 1976 color space. In the present invention, if colors are different between the outermost surface and the inside of the sintered body of the oxide evaporation material, the L* value is determined based on the inside of the sintered body.

According to the experiments by the present inventors, when the inside of the oxide evaporation material has an L* value of 62 to 95, a transparent conducting film having both a high conductivity and a high transmittance in the visible to near-infrared region can be obtained, even when a small amount of oxygen is introduced into a film-formation vacuum chamber. Moreover, the more whitish, the larger the L* value; in contrast, the more blackish, the smaller the L* value. It is thought that: the L* value of an oxide evaporation material is correlated with the amount of oxygen contained in the oxide evaporation material; the larger the L* value, the higher the oxygen content; and the smaller the L* value, the lower the oxygen content. The present inventors have made experiments on forming a transparent conducting film by vacuum deposition methods using oxide evaporation materials of various L* values under different formation conditions. In the experiments, the larger the L* value, the smaller the optimal amount of oxygen introduced during the film formation (i.e., the amount of oxygen to obtain a film having a low resistance and a high transparency). This is because an oxide evaporation material having a larger L* value supplies larger amount of oxygen therefrom. Meanwhile, it was shown that the difference in composition between the film and the oxide evaporation material tends to be large when a large amount of oxygen is introduced. Thus, the larger the L* value, the smaller the difference in composition.

Note that the oxide evaporation material according to the present invention has a high conductivity, and the conductivity of the oxide evaporation material is dependent on not only the oxygen content, but also the density, the crystal diameter, and the cerium-doping efficiency. Accordingly, the conductivity of the oxide evaporation material does not correlate with the L* value on a 1:1 basis.

When vacuum deposition is performed on the oxide evaporation material according to the present invention containing indium oxide as the main component and cerium, particles are evaporated mainly in the form of $In_2O_{3-x}$ and $CeO_{2-x}$ from the oxide evaporation material. The particles absorb oxygen in a chamber while reacting with oxygen, and reach a substrate for film formation. When the particles are to reach the substrate and are deposited onto the substrate, the energy of the evaporated particles serves as a driving source for the substance movement, contributing to densification of the film and to enhancement of the adhesive force to the substrate. When the smaller the L* value of the oxide evaporation material, the smaller the amount of oxygen in the oxide evaporation material, and the larger the amount of oxygen deficiency in the evaporated particles. For this reason, a large amount of oxygen needs to be introduced into the vacuum chamber so as to increase the proportion of the particles that are oxidized before reaching the substrate. However, since the energy of evaporated particles is consumed when the particles are oxidized during the flying, this makes it difficult to obtain a dense film having a strong adhesive force to the substrate in reactive film formation with the amount of oxygen introduced being large. In contrast, in the reactive-evaporation film formation with the lowest possible amount of oxygen gas introduced, a film having high adhesion and high density characteristics is easily obtained. Such a film formation can be performed with the oxide evaporation material of the present invention.

Here, the L* value of smaller than 62 is not preferable. This is because the amount of oxygen in such an oxide evaporation material is too small. To obtain a film having a low resistance and a high transparency, the optimal amount of oxygen introduced into the film-formation vacuum chamber has to be large. This causes problems such as an increased difference in composition between the film and the oxide evaporation material as well as a great damage to the substrate during the film formation. Meanwhile, if the L* value exceeds 95, the amount of oxygen contained in the oxide evaporation material is too large. Accordingly, oxygen is excessively supplied from the oxide evaporation material to the film. As a result, a film having an optimal oxygen deficiency and a high conductivity cannot be obtained.

Meanwhile, Patent Document 3 proposes a sputtering target that is a sintered body of indium oxide containing cerium. The sintered body of indium oxide containing cerium produced according to the method described therein has a low L* value of 35 to 55. Thus, if such a sintered body is used as an oxide evaporation material, a large amount of oxygen needs to be introduced into a film-formation vacuum chamber to obtain an optimal film, causing the above-described problems. Accordingly, such a sputtering target cannot achieve the object of the present invention.

In this respect, the oxide sintered body to be deposited (oxide evaporation material) of the present invention having an L* value of 62 to 95 cannot be produced according to the conventional technique for producing a sputtering target. An oxide evaporation material having an appropriate oxygen amount (or oxygen deficiency amount) suitable for use in mass production by vacuum deposition methods can be manufactured by a method as follows.

Specifically, powders of indium oxide and cerium oxide are used as the raw materials of the oxide sintered body containing indium oxide as the main component and cerium. These powders are mixed and molded to form a compact, which is fired at high temperatures followed by reaction and sintering to thus produce the oxide sintered body. The powders of indium oxide and cerium oxide are not dedicated, and conventionally used raw materials can be used for the oxide sintered body. The average particle diameter of the powder used is 1.5 µm or smaller, preferably 0.1 to 1.1 µm.

As the method for mixing raw-material powders when the oxide sintered body is produced, a ball-mill mixing method is generally utilized. Such a method is also effective for producing the sintered body of the present invention. A ball mill is a device in which hard balls (having a ball diameter of 10 to 30 mm) such as ceramic and a material powder are put in a container and rotated for grinding and mixing the material to make a fine powder mixture. The ball mill (grinding medium) used has: a shell made of steel, stainless steel, nylon, or the like; and a lining made of alumina, magnetic material, natural silica, rubber, urethane, or the like. Examples of the ball include an alumina ball containing alumina as a main component thereof, natural silica, a nylon ball with iron core, and a zirconia ball. There are wet and dry grinding methods which are widely utilized for mixing and gridding a raw-material powder to obtain a sintered body.

Alternatively, a bead mill and a jet mill are also effective methods other than the ball mill mixing. Particularly, since the cerium oxide powder is a hard material, these methods are considerably effective when a raw material having a larger average particle diameter is used or when grinding and mixing need to be performed in a short period. In the bead mill, a container called a vessel is filled with beads (grinding media, having a bead diameter of 0.005 to 3 mm) by 70 to 90%, and a rotation shaft at the center of the vessel is rotated at a circumferential speed of 7 to 15 m/second to transmit the motion to the beads. Here, a slurry obtained by mixing a liquid with a material to be ground such as a raw-material powder is fed to the vessel with a pump. The beads collide with the slurry for pulverization and dispersion. In the case of the bead mill, the efficiency is increased by reducing the bead diameter in accordance with the material to be ground. Generally, the bead mill can achieve pulverization and mixing at an acceleration approximately 1000 times faster than that of the ball mill. The bead mill having such a mechanism is called by various names. For example, known are sand grinder, aquamizer, attritor, pearl mill, abex mill, ultra visco mill, dyno mill, agitator mill, co-ball mill, spike mill, SC mill, and so forth. Any of these can be used in the present invention. Meanwhile, the jet mill is a method in which high-pressure air or vapor jetted approximately at a speed of sound from a nozzle collides, as a high-speed jet, with a material to be ground such as a raw-material powder to create particle-on-particle impact, thereby grinding the material into fine particles.

As described above, first, an indium oxide powder and a cerium oxide powder are put into a ball mill pot in a desired ratio, and subjected to dry or wet mixing. Thus, a powder mixture is prepared. To obtain the oxide sintered body of the present invention, the blending ratio of the raw-material powders is adjusted in such a manner that the indium and cerium contents are 0.001 to 0.110 in the Ce/In atomic ratio.

Water and organic materials such as a dispersant and a binder are added to the powder mixture thus prepared to form a slurry. The viscosity of the slurry is preferably 150 to 5000 cP, more preferably 400 to 3000 cP.

Next, the obtained slurry and beads are put in a container of a bead mill for processing. Examples of the bead material include zirconia, alumina, and the like. From the viewpoint of wearing resistance, zirconia is preferable. The diameter of the bead is preferably 1 to 3 mm from the viewpoint of grinding efficiency. The number of passes may be one, preferably two or more times, and a sufficient effect is obtained when the number of passes is five or less. The processing time is preferably 10 hours or shorter, further preferably 4 to 8 hours.

By such processing, the indium oxide powder and the cerium oxide powder in the slurry are ground and mixed well.

Next, the slurry thus processed is molded. As the molding method, any of casting molding and press molding can be adopted. When casting molding is performed, the obtained slurry is poured into a die for casting molding to form a green compact. The time from the bead mill processing to the casting is preferably within 10 hours. Thereby, the resultant slurry can be prevented from exhibiting thixotropy. Meanwhile, when press molding is performed, a binder such as polyvinyl alcohol, and the like are added to the obtained slurry. After water content adjustment when necessary, the mixture is dried with a spray dryer or the like, and granulated. The obtained granulated powder is filled into a die of a predetermined size, and then subjected to uniaxial press molding with a press at a pressure of 100 to 1000 kg/cm$^2$ to form a green compact. The thickness of the green compact at this time is preferably set to a thickness enough to obtain a sintered body of a predetermined size, in consideration of shrinkage in the subsequent firing process.

When an oxide sintered body is produced using the above-described green compact formed from the powder mixture, pressureless sintering is preferably adopted for the production because the method achieves production of a large-sized sintered body at a low cost. An oxide sintered body is obtained by firing in this pressureless sintering as follows.

First, the obtained green compact is heated at 300 to 500° C. for approximately 5 to 20 hours to remove the binder. After that, the temperature is increased for sintering. The rate of temperature rise is 150° C./hour or lower, preferably 100° C./hour or lower, and further preferably 80° C./hour or lower, to effectively release the void inside the compact to the outside. The sintering temperature is 1150 to 1300° C., preferably 1200 to 1250° C. The sintering time is 1 to 20 hours, preferably 2 to 5 hours. It is important that the binder-removing process to the sintering process be performed while oxygen is introduced into a furnace at a rate of 5 liters/minute or more per 0.1 m$^3$ of the furnace capacity. Oxygen tends to dissociate from a sintered body at 1150° C. or higher, so that the sintered body is likely to be in an excessive reduction state. The reason that oxygen is introduced during the sintering process is to avoid this phenomenon. Once a sintered body having oxygen deficiency excessively introduced therein is formed in this process, it is difficult to optimally adjust the oxygen deficiency amount of the sintered body in the subsequent oxygen-amount adjustment process. If the firing temperature exceeds 1300° C., oxygen rapidly dissociates even in an oxygen atmosphere as described above, so that the sintered body is likely to be in an excessive reduction state. Thus, the temperature exceeding 1300° C. is not preferable for the same reason. Meanwhile, if the firing temperature is lower than 1150° C., the temperature is too low to obtain a sintered body having a sufficient strength by the sintering. Thus, the temperature lower than 1150° C. is not preferable.

After the sintering, the oxygen-amount adjustment process is performed on the sintered body. It is important that the oxygen-amount adjustment process be performed at a heating temperature of 900 to 1100° C., preferably 950 to 1050° C., for a heating time of 10 hours or longer. During the cooling to the heating temperature of the oxygen-amount adjustment process, oxygen is continuously introduced. The temperature is lowered at a rate of temperature drop of 0.1 to 20° C./minute, preferably 2 to 10° C./minute.

In the oxygen-amount adjustment process on the sintered body, the atmosphere control in the furnace is also particularly important. Specifically, it is important that gases introduced to the furnace be controlled in a way that the mixing ratio (volume ratio) of oxygen to argon is within a range of $O_2/Ar=40/60$ to $90/10$, and that the gases be introduced into the furnace at a rate of 5 liters/minutes or more per 0.1 m³ of the furnace capacity. Such precise adjustments of temperature, atmosphere and time allow production of a sintered body which has the above-described L* value specified in the present invention, and which is useful as an oxide evaporation material.

The heating temperature in the oxygen-amount adjustment process of lower than 900° C. is not preferable. This is because, at such a temperature, dissociation and absorption reactions of oxygen proceed slowly, and it takes long for the reduction process to proceed uniformly to the inside of the sintered body. The temperature exceeding 1100° C. is not preferable. This is because, at such a temperature, oxygen dissociates too rapidly, making impossible the optimal reduction process by the atmosphere. The heating time in the oxygen-amount adjustment process of 10 hour or shorter is not preferable because the reduction process cannot proceed uniformly to the inside of the sintered body. The mixing ratio of gases ($O_2$/Ar) introduced to the furnace of lower than 40/60 is not preferable. This is because the reduction due to the dissociation of oxygen excessively predominates in such a condition, resulting in a sintered body having an L* value of smaller than 62. Meanwhile, the mixing ratio of gases ($O_2$/Ar) introduced to the furnace of exceeding 90/10 is not preferable. This is because the oxidization excessively predominates in such a condition, resulting in a sintered body having an L* value exceeding 95.

To obtain the oxide evaporation material of the present invention, it is important to perform an annealing process in a gas atmosphere where an oxygen gas is precisely diluted with an argon gas as described above, that is, in an atmosphere where the oxygen amount is precisely controlled. The atmosphere gases do not always have to be the gas mixture of oxygen and argon. For example, other inert gases such as helium and nitrogen can be used effectively in place of argon. Even air can also be effectively used in place of argon, if the oxygen content in the entire gas mixture is precisely controlled at a constant level. However, if an oxygen gas is introduced into a furnace performing firing with the air as in a conventional technique, the oxygen content of the atmosphere in the furnace cannot be controlled precisely; thus, such atmosphere gases cannot be used effectively. As proposed in the present invention, when a gas mixture having the content ratio of an oxygen gas precisely controlled with an inert gas is introduced to fill a furnace, an oxide evaporation material in an optimal reduction state is obtained.

After the oxygen-amount adjustment process, the temperature is lowered to room temperature at 10° C./minute, and the sintered body can be taken out from the furnace at room temperature. The sintered body thus obtained is processed by, for example, cutting into predetermined dimensions to thereby form an oxide evaporation material. Alternatively, when used is a green compact designed to have predetermined dimensions after the firing in consideration of shrinkage by the sintering, a resultant sintered body can be utilized as the oxide evaporation material without the cutting process after the sintering.

Incidentally, as one method to obtain a high-density sintered body among methods for producing a sputtering target, hot pressing is known to be effective. However, when hot pressing is employed for the materials of the present invention, the obtained sintered body tends to have an L* value of 40 or smaller because of its greatly reduced state. Thus, the aforementioned pressureless sintering is preferable as the production method of the present invention.

Meanwhile, the oxide evaporation material of the present invention can be used in the form of cylindrical tablets or pellets having a diameter of 10 to 50 mm and a height of 10 to 50 mm, for example. Furthermore, the oxide evaporation material can be utilized in the form of granules of approximately 1 to 10 mm obtained by grinding the sintered body as described above.

The oxide evaporation material according to the present invention may contain, for example, tungsten and molybdenum as other elements than indium, cerium and oxygen as long as the above-described conditions are satisfied. The oxide evaporation material is further allowed to contain tin, zinc, cadmium, gallium, and the like, with the proviso that the characteristics of the present invention are not impaired. However, if the vapor pressure of an oxide of a metal is much higher than the vapor pressures of indium oxide and cerium oxide, it is preferable not to contain ions of such a metal. This is because the evaporation by various vacuum deposition methods is difficult. For example, oxides of metals such as aluminum, titanium, silicon, germanium, and zirconium have vapor pressures much higher than those of indium oxide and cerium oxide. Accordingly, when contained in the oxide evaporation material, such metals are difficult to evaporate together with indium oxide and cerium oxide. For this reason, these metals remain in the oxide evaporation material and are highly concentrated, causing adverse influences such as hindering of evaporation of indium oxide and cerium oxide in the end. Thus, such metals must not be contained.

Moreover, in the oxide evaporation material according to the present invention, cerium may be formed only of an indium oxide phase with an indium site substituted with cerium, or may in a mixture form of a cerium oxide phase and an indium oxide phase with an indium site substituted with cerium. Furthermore, these forms may be mixed with a cerium oxide compound phase and an indium oxide compound phase.

When a transparent conducting film is formed by various vacuum deposition methods using the oxide evaporation material of the present invention, the oxygen content in the oxide evaporation material is already optimally adjusted. Accordingly, even when a small amount of oxygen is introduced into a film-formation vacuum chamber, a transparent conducting film having optimal oxygen deficiency is obtained. This brings about advantages that the difference in composition is made small between the transparent conducting film and the oxide evaporation material, reducing the influence on the characteristic variation caused by the change in the amounts of oxygen introduced.

(2) Transparent Conducting Film

A crystalline film (transparent conducting film) of indium oxide containing cerium can be formed by various vacuum deposition methods such as electron beam deposition, ion plating, and high-density plasma-assist evaporation, using the oxide evaporation material according to the present invention, the oxide evaporation material being formed of the sintered body containing indium oxide as the main component and cerium, having a cerium content of 0.001 to 0.110 in the Ce/In atomic ratio, and having an L* value in the CIE 1976 color space of 62 to 95.

Since the transparent conducting film is a crystalline film, a high mobility can be exhibited when an indium site of indium oxide is substituted with cerium in a solid solution form. The crystalline film (transparent conducting film) can be obtained by heating a substrate at 180° C. or higher during the film formation. Alternatively, the crystalline film can be obtained by a method in which a film obtained without heating the substrate is annealed at 180° C. or higher.

The crystalline transparent conducting film according to the present invention can be formed from the oxide evaporation material that has a composition slightly different from that of the film. Accordingly, the transparent conducting film is an indium oxide film containing cerium with the Ce/In atomic ratio of 0.001 to 0.110. If the cerium content (Ce/In atomic ratio) in the film is lower than 0.001, the effect of increasing the mobility is small, and a low-resistance film cannot be obtained. Meanwhile, if the cerium content exceeds 0.110, the film contains cerium excessively. Thus, when electrons move, the neutral impurity scattering is increased, and the mobility is decreased. Thus, a low-resistance film cannot be obtained. A more preferable cerium content to obtain a transparent conducting film having a higher mobility is 0.004 to 0.051 in the Ce/In atomic ratio. With a composition within such a range, it is possible to form a transparent conducting film having a carrier concentration of $3.5 \times 10^{20}$ cm$^{-3}$ or lower, a hole mobility of 80 cm$^2$/V·s or more and a specific resistance of $3.5 \times 10^{-4}$ Ωcm or lower. Such a transparent conducting film can also be formed when tungsten is contained in the W/In atomic ratio of 0.001 to 0.020 or molybdenum is contained in the Mo/In atomic ratio of 0.001 to 0.050 with the proviso that cerium is contained in the Ce/In atomic ratio of 0.004 to 0.051. Moreover, since the transparent conducting film according to the present invention has a low carrier concentration, the film itself has a considerably high average transmittance of 80% or more at a wavelength of 800 to 1200 nm.

(3) Solar Cell

A solar cell according to the present invention is a photoelectric conversion element characterized in that the above-described transparent conducting film is used as an electrode. The structure of the solar cell element is not particularly limited, and examples thereof include: a PN junction type in which a p-type semiconductor and an n-type semiconductor are stacked; a PIN junction type in which an insulating layer (I layer) is interposed between a p-type semiconductor and an n-type semiconductor; and the like.

Solar cells are roughly classified according to the kind of semiconductor: solar cells using silicon-based semiconductors such as single-crystal silicon, polycrystalline silicon, and amorphous silicon, as photoelectric conversion elements; compound thin-film solar cells using thin films of compound semiconductors typified by CuInSe-based, Cu(In,Ga)Se-based, Ag(In,Ga)Se-based, CuInS-based, Cu(In,Ga)S-based, and Ag(In,Ga)S-based compound semiconductors, solid solutions thereof, and GaAs-based and CdTe-based compound semiconductors, as photoelectric conversion elements; and dye-sensitized solar cell using organic dyes (also called Grätzel solar cells). The solar cell according to the present invention includes any of the above types, and by using the above-described transparent conducting film as an electrode, a high efficiency is achieved. Particularly, in solar cells using amorphous silicon and compound thin-film solar cells, a transparent conducting film is essential as an electrode on the side where sunlight enters (light-receiving side, front side). By using the transparent conducting film of the present invention, a high conversion-efficiency characteristic is exhibited.

The silicon-based solar cell is described briefly. In a PN junction type solar cell element, used is a single crystal or polycrystalline silicon substrate having a thickness of approximately 0.2 to 0.5 mm and a size of approximately 180 mm square, for example. Inside the silicon substrate of the element, a PN junction is formed by joining a P layer containing a large number of P-type impurities such as boron and an N layer containing a large number of N-type impurities such as phosphorus.

In place of the silicon substrate, a transparent substrate such as a glass plate, a resin plate, and a resin film can be used.

In the present invention, a transparent substrate is preferable. In this case, after the transparent conducting film of the present invention is formed on the substrate as an electrode, amorphous or polycrystalline silicon is stacked thereon. Thus, the solar cell of the present invention is classified as a silicon-based thin-film solar cell.

In the case of amorphous silicon, a PIN junction is formed with an insulating layer (I layer) interposed in the PN junction. Specifically, the structure as shown in FIG. 1 has a front-side (light-receiving side) transparent electrode film 2, a p-type amorphous silicon film or hydrogenated amorphous silicon carbide film 3, an amorphous silicon film 4 containing no impurities, an n-type amorphous silicon film 5, a back side transparent electrode film (contact improving layer) 6, and a back-side metal electrode, i.e., back-surface electrode 7 are stacked on a glass substrate 1. Note that the p-type amorphous silicon film or hydrogenated amorphous silicon carbide film 3, the amorphous silicon film 4 containing no impurities, and the n-type amorphous silicon film 5 are normally formed by a plasma CVD method. These amorphous silicon films and hydrogenated amorphous silicon film may contain germanium, carbon, nitrogen, tin, or the like to control the light absorption wavelength.

Note that thin-film solar cells using silicon thin films are classified into: one in which a photoelectric conversion layer including a silicon thin film (i.e., a PIN junction layer) is formed of a amorphous silicon-based thin film; one in which such a PIN junction layer is formed of a microcrystalline silicon-based thin film; and one in which a photoelectric conversion layer formed of an amorphous silicon-based thin film and a photoelectric conversion layer formed of a microcrystalline silicon-based thin film are stacked (tandem thin-film photoelectric conversion layers). There is also a solar cell including three or more layers of photoelectric conversion layers. As long as the transparent conducting film of the present invention is used as an electrode, the solar cell according to the present invention includes any of these structures. Besides, the solar cell according to the present invention includes a hybrid photoelectric conversion layer in which a photoelectric conversion layer of a single-crystal silicon plate or polycrystalline silicon plate and the thin-film photoelectric conversion layers are stacked, as long as the transparent conducting film of the present invention is used as an electrode.

Next, the compound thin-film solar cell is described. In a solar cell using a compound thin film, normally a heterojunction is formed between a compound semiconductor thin film (n-type semiconductor intermediate layer) having a large bandgap and a compound semiconductor (p-type semiconductor light-absorbing layer) having a small bandgap. The general structure is front-surface electrode (transparent conducting film)/window layer/intermediate layer/light-absorbing layer/back-surface electrode (metal or transparent conducting film).

Figure 2:
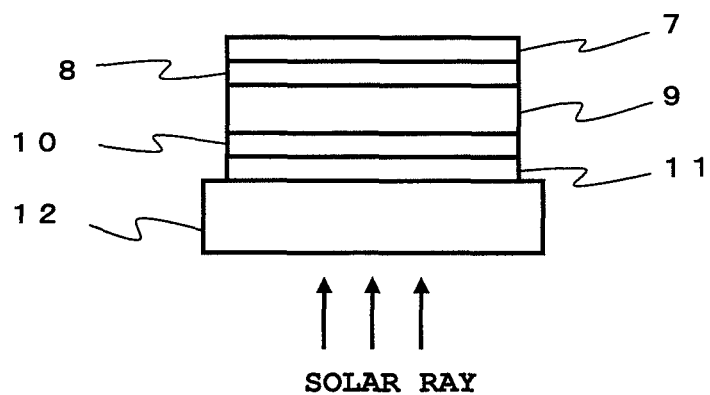
FIG. 2 is an explanatory drawing showing a schematic structure of a compound thin-film solar cell in which the electrode layer formed of the transparent conducting film according to the present invention is used on a glass-substrate side.
Figure 3:
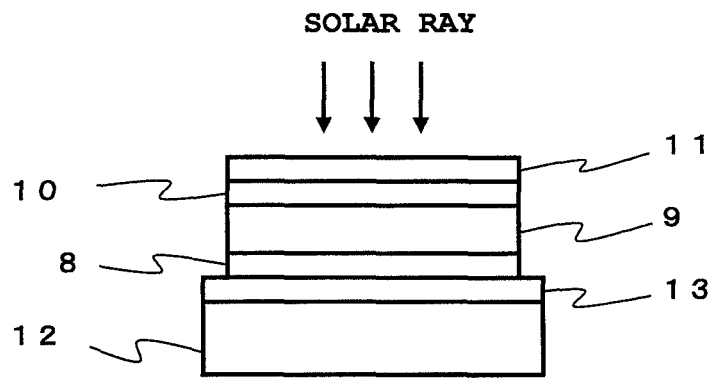
FIG. 3 is an explanatory drawing showing a schematic structure of the compound thin-film solar cell in which the electrode layer formed of the transparent conducting film according to the present invention is used on the side opposite to the glass substrate.

Specifically, as shown in FIG. 2, a transparent electrode film 11 made of the transparent conducting film of the present invention, a window layer 10, a semiconductor intermediate layer 9, a p-type semiconductor light-absorbing layer 8, and a back-surface electrode 7 are stacked on a glass substrate 12. Meanwhile, in FIG. 3, a lower electrode, i.e., back-surface electrode 13, the p-type semiconductor light-absorbing layer 8, the semiconductor intermediate layer 9, the window layer 10, and the transparent electrode film 11 made of the transparent conducting film of the present invention are stacked on the glass substrate 12. In any of these structures, solar ray enters from the side on which the transparent electrode film 11 is provided.

Incidentally, the substrate is not particularly limited by the aforementioned material such as glass, resin, metal and ceramic. Although the substrate may be transparent or non-transparent, a transparent substrate is preferable. In the case of a resin, the resin can be used in various forms such as plate or film. The resin may have a low melting point of 150° C. or lower, for example. Examples of the metal include stainless steel, aluminum, and the like. Examples of the ceramic include alumina, zinc oxide, carbon ceramic, silicon nitride, silicon carbide, and the like. As oxides other than alumina and zinc oxide, oxides of Ga, Y, In, La, Si, Ti, Ge, Zr, Sn, Nb and Ta may be selected. Examples of these oxides include $Ga_2O_3$, $Y_2O_3$, $In_2O_3$, $La_2O_3$, $SiO_2$, $TiO_2$, $GeO_2$, $ZrO_2$, $SnO_2$, $Nb_2O_5$, $Ta_2O_5$, and the like. In the present invention, these substrates made of glass, resin, and ceramic are referred to as nonmetal substrates. Substrate surfaces are desirably processed by providing a mountain-shaped unevenness on at least one surface, or by roughing a surface by etching or the like, so that incident solar ray is likely to be reflected.

As the back-surface electrodes 7, 13, a conductive electrode material is used such as Mo, Ag, Au, Al, Ti, Pd, Ni, and alloys thereof. Any of Mo, Ag, Au and Al is preferable. The thickness is normally 0.5 to 5 μm, preferably 1 to 3 μm. The formation means is not particularly limited. For example, DC magnetron sputtering, vacuum deposition methods, CVD methods, and the like can be utilized.

As the p-type semiconductor forming the light-absorbing layer 8, it is possible to use $CuInSe_2$, $CuInS_2$, $CuGaSe_2$, $CuGaS_2$, $AgInSe_2$, $AgInS_2$, $AgGaSe_2$, $AgGaS_2$, solid solutions thereof, and CdTe. Conditions necessary to obtain higher energy conversion efficiency are: an optimal optical design to obtain a large amount of photocurrent, and to form a thin film and heterojunction high in quality that is less in recombination of carriers in the interface or particular in the absorbing layer. The thickness is normally 1 to 5 μm, preferably 2 to 3 μm. The formation means is not particularly limited. For example, vacuum deposition methods, CVD methods, and the like can be utilized. The high-quality heterointerface is closely related to the combination of intermediate layer/absorbing layer; useful heterojunctions are obtained in CdS/CdTe, $CdS/CuInSe_2$, $CdS/Cu(In,Ga)Se_2$, $CdS/Ag(In,Ga)Se_2$, and the like.

To increase the efficiency of the solar cell, a semiconductor having a larger bandgap, for example, CdS, CdZnS, or the like is used as the semiconductor thin film forming the intermediate layer 9. With these semiconductor thin films, the sensitivity to short wavelengths of sunlight is improved. The thickness is normally 10 to 200 nm, preferably 30 to 100 nm. The formation means for the intermediate layer 9 is not particularly limited. In the case of CdS thin film, the film is formed by a chemical bath deposition method using a solution mixture of $CdI_2$, $NH_4Cl_2$, $NH_3$, and thiourea. Furthermore, at the light incident side of CdS or (Cd,Zn)S that is the intermediate layer 9, a semiconductor having a larger bandgap than these thin films can be disposed as the window layer 10. Thereby, a high-performance solar cell with high reproducibility is obtained. The window layer 10 is formed of a thin film of, for example, ZnO or (Zn,Mg)O having a conductivity substantially the same as a CdS thin film. The thickness is normally 50 to 300 nm, preferably 100 to 200 nm. The formation means for the window layer 10 is not particularly limited. For example, the window layer 10 is formed by DC magnetron sputtering using a target such as ZnO and Ar as a sputtering gas.

When the solar cell according to the present invention is a compound thin-film solar cell, the transparent conducting film of the present invention is used as an electrode on the side where sunlight enters (the front surface and/or the back surface). Since the transparent conducting film of the present invention is lower in resistance and higher in transmittance than a conventional transparent conducting film, a high conversion efficiency is achieved.

Incidentally, in any types of the aforementioned solar cell elements, a bus bar electrode and a finger electrode are formed on each of the light-receiving surface (front surface) side and the back-surface side by screen printing or the like using silver paste. The substantially entire surfaces of these electrode surfaces are coated with solder for the protection and for easier attachment of a connection tabs. When the solar cell element has a silicon substrate, a transparent protection member such as a glass plate, a resin plate, or a resin film is provided on the light-receiving surface side.

The thickness of the transparent conducting film according to the present invention, forming the electrode is not particularly limited. However, although depending on the composition of the material, for example, the thickness is desirably 150 to 1500 nm, particularly 200 to 900 nm. Since the transparent conducting film of the present invention is low in resistance and high in transmittance of sunlight including the visible ray to near-infrared ray at a wavelength of 380 nm to 1200 nm, a light energy of sunlight is considerably effectively converted into an electrical energy.

It should be noted that the transparent conducting film according to the present invention is useful as a transparent electrode of light detecting elements, touch panels, flat panel displays (such as LCDs, PDPs and ELs), light emitting devices (such as LEDs and LDs) in addition to the solar cells. For example, the light detecting element has a structure in which a glass electrode, a transparent electrode on the light incident side, a light-detecting material layer for infrared ray and the like, and a back-surface electrode are stacked. The light-detecting material layer for detecting infrared ray includes a type which uses a Ge or InGeAs-based semiconductor material [photodiode (PD) and avalanche photodiode (APD)]; and a type which uses, for example, a material formed by adding at least one element selected from the group consisting of Eu, Ce, Mn and Cu, and at least one element selected from the group of Sm, Bi and Pb to a sulfide or selenide of an alkaline earth metal element. Besides, there is known APDs using layers of amorphous silicon germanium and amorphous silicon. Any of these can be used.

Examples of the present invention are described below in detail.

EXAMPLES 1 TO 4

Manufacturing of Oxide Evaporation Material

An $In_2O_3$ powder having an average particle diameter of 0.8 μm and a $CeO_2$ powder having an average particle diameter of 1 μm were used as raw-material powders. These $In_2O_3$ and $CeO_2$ powders were blended in such a manner that the Ce/In atomic ratio was to be 0.008. The powders were put in a resin pot, and mixed with a wet ball mill. At this time, hard $ZrO_2$ balls were used, and the mixing time was 20 hours.

After the mixing, the slurry was taken out, and a polyvinyl alcohol binder was added to the obtained slurry. The mixture was dried with a spray dryer or the like, and granulated.

The granulated product was subjected to uniaxial press molding at a pressure of 1 ton/cm². Thus, a cylindrical green compact having a diameter of 30 mm and a thickness of 40 mm was obtained.

Next, the obtained green compact was sintered as follows.

Specifically, the green compact was heated at 300° C. in the air in a sintering furnace for approximately 10 hours to remove the binder from the green compact. Then, the temperature was increased at a rate of 1° C./minute in an atmosphere into which oxygen was introduced at a rate of 5 liters/minute per 0.1 m³ of the furnace capacity. At 1250° C., the resulting green compact was sintered for 2 hours (pressureless sintering). Oxygen was continuously introduced, also during the cooling after the sintering where the temperature was lowered to 1000° C. at 10° C./minute.

Next, the introduced gas was switched to a gas mixture of oxygen and argon, and heating was performed at 1000° C. and kept for 15 hours (hereinafter, this process is referred to as an oxygen-amount adjustment process on the sintered body). Thereafter, the temperature was lowered at 10° C./minute to room temperature.

By changing the mixing ratio of oxygen to argon in the gas mixture, oxide sintered bodies (oxide evaporation materials) of various L* values were obtained.

Specifically, the oxide evaporation material according to Example 1 was manufactured under the condition where the flow ratio (i.e., volume ratio) of oxygen gas/argon gas was "40/60." The oxide evaporation material according to Example 2 was manufactured under the condition where the volume ratio was "60/40." The oxide evaporation material according to Example 3 was manufactured under the condition that the volume ratio was "80/20." The oxide evaporation material according to Example 4 was manufactured under the condition that the volume ratio was "90/10."

Note that the volumes and the weights of the obtained oxide sintered bodies (oxide evaporation materials) were measured to calculate the densities which were 5.4 to 5.8 g/cm³. Additionally, the fractured surfaces of the oxide sintered bodies were observed with a scanning electron microscope to obtain the average diameters of 100 crystal particles in the oxide sintered bodies. It was found out that any of the oxide sintered bodies had an average diameter of 2 to 7 μm. Moreover, by the four-point probe method with a resistivity meter, the sheet resistances were measured on surfaces of the oxide sintered bodies to be radiated with electron beam to calculate the specific resistances. It was found out that the sheet resistances were 1 kΩcm or lower. Furthermore, composition analysis was performed on all of the oxide sintered bodies by ICP optical emission spectrometry. It was found out that the oxide sintered bodies had the composition thus fed. In addition, the L* values in the CIE 1976 color space of the surfaces and the insides of the sintered bodies were measured with a color difference meter (spectro guide, E-6834 manufactured by BYK-Gardner GmbH). The values were shown to be almost the same.

Table 1a shows the flow ratios (i.e., volume ratios) of oxygen gas/argon gas in the gas mixtures introduced in the oxygen-amount adjustment process on the sintered bodies, and the L* values of the obtained oxide sintered bodies (oxide evaporation materials).

TABLE 1a

|  | A | B | L* value of oxide evaporation material | Optimal oxygen mixed amount |
|---|---|---|---|---|
| Example: |  |  |  |  |
| 1 | 0.008 | 40/60 | 62 | 9 |
| 2 | 0.008 | 60/40 | 86 | 8 |
| 3 | 0.008 | 80/20 | 91 | 5 |
| 4 | 0.008 | 90/10 | 95 | 3 |

TABLE 1a-continued

|  | A | B | L* value of oxide evaporation material | Optimal oxygen mixed amount |
|---|---|---|---|---|
| Comparative Example: |  |  |  |  |
| 1 | 0.008 | 30/70 | 58 | 16 |
| 2 | 0.008 | 100/0 | 98 | 0 |
| 3 | 0.008 | — | 50 | 35 |
| Example: |  |  |  |  |
| 5 | 0.051 | 40/60 | 64 | 8 |
| 6 | 0.051 | 60/40 | 85 | 7 |
| 7 | 0.051 | 80/20 | 91 | 4 |
| 8 | 0.051 | 90/10 | 94 | 3 |
| Comparative Example: |  |  |  |  |
| 4 | 0.051 | 30/70 | 57 | 15 |
| 5 | 0.051 | 100/0 | 97 | 0 |
| 6 | 0.051 | — | 49 | 42 |
| Example: |  |  |  |  |
| 9 | 0.001 | 60/40 | 84 | 7 |
| 10 | 0.002 | 60/40 | 85 | 7 |
| 11 | 0.004 | 60/40 | 85 | 6 |
| 12 | 0.061 | 60/40 | 84 | 6 |
| 13 | 0.070 | 60/40 | 85 | 5 |
| 14 | 0.090 | 60/40 | 85 | 5 |
| 15 | 0.110 | 60/40 | 83 | 4 |

*(Remarks)
A: Ce/In atomic ratio of oxide evaporation material,
B: $O_2$/Ar flow ratio in oxygen-amount adjustment for sintered body TABLE 1b

| | Film characteristics with optimal oxygen mixed amount | | | | |
|---|---|---|---|---|---|
| | Specific resistance (μΩcm) | Carrier concentration (cm$^{-3}$) | Hole mobility (cm²/Vs) | Transmittance of film itself (%) | |
| | | | | Visible region | Near infrared region |
| Example: | | | | | |
| 1 | 210 | 3.13 × 10²⁰ | 95 | 91 | 85 |
| 2 | 210 | 3.01 × 10²⁰ | 99 | 91 | 85 |
| 3 | 210 | 3.04 × 10²⁰ | 98 | 91 | 84 |
| 4 | 210 | 3.10 × 10²⁰ | 96 | 91 | 85 |
| Comparative Example: | | | | | |
| 1 | 240 | 3.06 × 10²⁰ | 85 | 91 | 85 |
| 2 | 250 | 2.60 × 10²⁰ | 96 | 91 | 85 |
| 3 | 280 | 2.69 × 10²⁰ | 83 | 91 | 84 |
| Example: | | | | | |
| 5 | 350 | 2.20 × 10²⁰ | 81 | 91 | 86 |
| 6 | 350 | 2.23 × 10²⁰ | 80 | 91 | 86 |
| 7 | 350 | 2.18 × 10²⁰ | 82 | 91 | 85 |
| 8 | 350 | 2.15 × 10²⁰ | 83 | 91 | 85 |
| Comparative Example: | | | | | |
| 4 | 470 | 1.77 × 10²⁰ | 75 | 91 | 85 |
| 5 | 370 | 2.09 × 10²⁰ | 81 | 91 | 84 |
| 6 | 490 | 1.77 × 10²⁰ | 72 | 91 | 85 |
| Example: | | | | | |
| 9 | 410 | 1.88 × 10²⁰ | 81 | 91 | 87 |
| 10 | 370 | 2.11 × 10²⁰ | 80 | 91 | 86 |
| 11 | 310 | 2.40 × 10²⁰ | 84 | 91 | 85 |
| 12 | 410 | 2.03 × 10²⁰ | 75 | 90 | 78 |
| 13 | 510 | 1.83 × 10²⁰ | 67 | 90 | 76 |
| 14 | 530 | 1.93 × 10²⁰ | 61 | 90 | 75 |
| 15 | 620 | 1.74 × 10²⁰ | 58 | 89 | 72 |

TABLE 1c

Film characteristics with optimal oxygen mixed amount

| | Film crystalline | Ce/In atomic ratio of film | Film adhesive force to substrate | Fracture on oxide evaporation material |
|---|---|---|---|---|
| Example: | | | | |
| 1 | crystalline film | 0.008 | strong | no fracture |
| 2 | crystalline film | 0.008 | strong | no fracture |
| 3 | crystalline film | 0.008 | strong | no fracture |
| 4 | crystalline film | 0.008 | strong | no fracture |
| Comparative Example: | | | | |
| 1 | crystalline film | 0.018 | weak | no fracture |
| 2 | crystalline film | 0.008 | strong | no fracture |
| 3 | crystalline film | 0.027 | weak | fracture |
| Example: | | | | |
| 5 | crystalline film | 0.051 | strong | no fracture |
| 6 | crystalline film | 0.051 | strong | no fracture |
| 7 | crystalline film | 0.051 | strong | no fracture |
| 8 | crystalline film | 0.051 | strong | no fracture |
| Comparative Example: | | | | |
| 4 | crystalline film | 0.075 | weak | no fracture |
| 5 | crystalline film | 0.051 | strong | no fracture |
| 6 | crystalline film | 0.089 | weak | fracture |
| Example: | | | | |
| 9 | crystalline film | 0.001 | strong | no fracture |
| 10 | crystalline film | 0.002 | strong | no fracture |
| 11 | crystalline film | 0.004 | strong | no fracture |
| 12 | crystalline film | 0.061 | strong | no fracture |
| 13 | crystalline film | 0.070 | strong | no fracture |
| 14 | crystalline film | 0.090 | strong | no fracture |
| 15 | crystalline film | 0.110 | strong | no fracture |

Forming of Transparent Conducting Film, Film Characteristics Evaluation, and Film Formation Evaluation (1) For forming of a transparent conducting film, a magnetic field deflection-type electron beam evaporator was used.

The evacuation system includes a low evacuation system with a rotary pump and a high evacuation system with a cryopump. The evacuation is possible to $5 \times 10^{-5}$ Pa. Electron beams are generated by heating a filament, and accelerated by the electric field applied between the cathode and the anode. The electron beams are curved in the magnetic field of the permanent magnet, and then radiated to an oxide evaporation material placed in a tungsten crucible. The intensity of the electron beams can be adjusted by changing the voltage applied to the filament. Moreover, the radiation position of the beams can be changed by changing the acceleration voltage applied between the cathode and the anode.

Films were formed under the following conditions.

An Ar gas and an $O_2$ gas were introduced into the vacuum chamber and the pressure was kept at $1.5 \times 10^{-2}$ Pa. In this event, a transparent conducting film is obtained by changing the mixing ratio of the Ar gas to the $O_2$ gas introduced into the vacuum chamber. Then, the characteristics of the transparent conducting film were evaluated. Each of the cylindrical oxide evaporation materials of Examples 1 to 4 was disposed standing in the tungsten crucible. Electron beams were radiated to a central portion of the circular surface of the oxide evaporation material, so that a transparent conducting film having a thickness of 200 nm was formed on a Corning 7059 glass substrate having a thickness of 1.1 mm. The electron gun was set at a voltage of 9 kV and a current value of 150 mA. The substrate was heated at 250° C.

(2) The characteristics of the thin films (transparent conducting films) thus obtained were evaluated in the following procedure.

First, the sheet resistance of each of the thin films (transparent conducting films) was measured by the four-point probe method with a resistivity meter, Loresta-EP (manufactured by Dia Instruments Co., Ltd., Model MCP-T360). The thickness of the thin film (transparent conducting film) was evaluated from the measurement, with a contact profilometer (manufactured by KLA-Tencor Corporation), based on the difference in step height between portions where the film was formed and not formed to calculate the specific resistance. Moreover, the carrier concentration and the hole mobility in the film at room temperature were measured by the Van der Pauw method with a Hall effect measurement system (ResiTest manufactured by TOYO Corporation).

Next, the transmittance of the film including the glass substrate (the glass substrate B with the film L) $[T_{L+B} (\%)]$ was measured with a spectrophotometer (U-4000 manufactured by Hitachi, Ltd.). The transmittance of only the glass substrate (the glass substrate B) $[T_B (\%)]$ was also measured by the same method to calculate the transmittance of the film itself by $[T_{L+B} \div T_B] \times 100(\%)$.

The crystalline of the film was evaluated by X-ray diffraction measurement. As the X-ray diffractometer, X 'Pert PRO MPD (manufactured by PANalytical B.V.) was used. The measurement conditions were set in a wide range, and CuKα ray was used. The measurement was performed with a voltage of 45 kV and a current of 40 mA. The film crystalline was evaluated according to the presence or absence of an X-ray diffraction peak. This result is also shown in the column of "film crystalline" in Table 1c.

Next, the composition (Ce/In atomic ratio) of the film was measured by ICP optical emission spectrometry. The adhesive force of the film to the substrate was evaluated based on JIS C0021. The evaluation was made: favorable (strong) when the film was not peeled off; and not sufficient (weak) when the film was peeled off. These results are also shown in the columns of "Ce/In atomic ratio of film" and "film adhesive force to substrate" in Table 1c.

The specific resistance and the transmittance of each thin film (transparent conducting film) were dependent on the mixing ratio of the $O_2$ gas to the Ar gas introduced into the film-formation vacuum chamber during the film formation. The mixing ratio of the $O_2$ gas $[O_2/(Ar+O_2)(\%)]$ was changed from 0 to 50% in units of 1%, and the mixing ratio of the $O_2$ gas at which the lowest specific resistance was shown was determined as the optimal oxygen mixed amount. This result is shown in the column of "optimal oxygen mixed amount" in Table 1a.

A thin film (transparent conducting film) formed with an oxygen amount smaller than the optimal oxygen mixed amount was not only poor in conductivity but also low in transmittance in the visible region. Meanwhile, a thin film (transparent conducting film) formed with the optimal oxygen mixed amount was not only excellent in conductivity but also high in transmittance in the visible to near-infrared region.

(3) Using each oxide evaporation material of Examples 1 to 4, the film formation evaluation was performed. In this evaluation, obtained were: the specific resistance of the film, and the average transmittances of the film itself in the visible region (wavelength of 400 to 800 nm) and in the near-infrared region (wavelength of 800 to 1200 nm), in the case where the film has the optimal oxygen mixed amount.

These evaluation results are shown in the columns of "specific resistance" and "transmittance of film itself (%)" in Table 1b.

In the film formation using the oxide evaporation materials of Examples 1 to 4, the optimal oxygen mixed amount to be introduced into the film-formation vacuum chamber so as to obtain a transparent conducting film having the lowest resistance and the highest transmittance was considerably small. This is because each oxide evaporation material contained the optimal oxygen amount. Additionally, the film formed with the optimal oxygen mixed amount had the same composition as that of the oxide evaporation material, and exhibited not only considerably low specific resistance but also high transmittance in the visible to near-infrared region. Moreover, the film was observed to be a crystalline film of indium oxide with the bixbyite structure, and also had such a strong adhesive force to the substrate that the film can be used practically.

Furthermore, an electron gun was set at a voltage of 9 kV and a current value of 150 mA. After the radiation of electron beams for 60 minutes, the oxide evaporation material was visually observed to check whether the oxide evaporation material had a fracture or a crack (durability test on oxide evaporation material). The oxide evaporation materials of Examples 1 to 4 had no crack generated even after being continuously used (evaluated as "no fracture").

Such transparent conducting films can be said to be quite useful as a transparent electrode of solar cells.

COMPARATIVE EXAMPLES 1 AND 2

Oxide sintered bodies were produced as in the Examples 1 to 4 except that the mixing ratio of the introduced gases in the oxygen-amount adjustment process on the sintered bodies was changed. Specifically, the $O_2/Ar$ flow ratio was 30/70 in Comparative Example 1, and 100/0 in Comparative Example 2. The density, specific resistance, crystal particle diameter, and composition of the obtained sintered bodies were evaluated in the same way as above. Any of these parameters were equivalent to those of Examples 1 to 4. The colors of the surface and the inside each of the obtained oxide sintered bodies were the same. The L* value was measured, and shown in Table 1a.

Next, the film formation evaluation was performed as in Examples 1 to 4.

The result is also shown in Tables 1a to 1c above.

The oxide evaporation material of Comparative Example 1 had an L* value (58) smaller than the specified range of the present invention (62 to 95), and is characterized in that the optimal oxygen mixed amount (16) during the film formation was larger than those of the oxide evaporation materials of Examples 1 to 4. As to the film characteristics with the optimal oxygen mixed amount, the transmittance was equivalent to those of Examples 1 to 4. However, the specific resistance was slightly higher. This seems to be caused by the large difference in composition between the film and the evaporation material. Furthermore, the film of Comparative Example 1 had an adhesive force to the substrate weaker than those of Examples 1 to 4. This seems to be caused by a larger amount of oxygen introduced during the film formation. Such an oxide evaporation material greatly differs in composition from the film to be obtained, accordingly making it difficult to design the film composition. Moreover, since a larger amount of oxygen has to be introduced into the film-formation vacuum chamber, when the oxide evaporation material is used for the mass production of the films, the compositions and the characteristics of the films greatly vary from one another due to the influence of the change in the oxygen concentration in the vacuum chamber. Thus, it can be concluded that the oxide evaporation material of Comparative Example 1 is inappropriate for forming films in large quantities.

Meanwhile, Comparative Example 2 is an example of the oxide evaporation material having an L* value (98) larger than the specified range of the present invention. The optimal oxygen mixed amount during the film formation was 0%, but the specific resistance of the film was higher than those of Examples 1 to 4. This seems to be caused by the fact that too large an amount of oxygen was supplied from the oxide evaporation material to the film, which makes the oxygen content in the film large, hindering the introduction of the optimal amount of oxygen deficiency. Thus, it can be concluded that, even if such an oxide evaporation material is used for film formation, the film cannot exhibit a high conductivity that the composition of the evaporation material originally has.

COMPARATIVE EXAMPLE 3

Next, a sintered body of indium oxide containing cerium was produced according to the production technique for a sintered body of a sputtering target proposed in Patent Document 3.

First, an $In_2O_3$ powder having an average particle diameter of 1 μm or smaller and a $CeO_2$ powder having an average particle diameter of 1 μm or smaller were used as raw-material powders. These $In_2O_3$ and $CeO_2$ powders were blended in such a manner that the Ce/In atomic ratio was to be 0.008. The powders were put in a resin pot, and mixed with a wet ball mill. At this time, hard $ZrO_2$ balls were used, and the mixing time was 20 hours. After the mixing, the slurry was taken out, filtrated, dried, and then granulated. The granulated powder thus obtained was subjected to cold isostatic pressing at 3 t/cm² for molding.

The obtained green compact was put in a sintering furnace into which oxygen was introduced at a rate of 5 liters/minute per 0.1 m³ of the furnace capacity to create an atmosphere. The green compact was sintered at 1450° C. for 8 hours. In this event, the temperature was increased to 1000° C. at 1° C./minute, and from 1000 to 1450° C. at 2° C./minute. Then, the introduction of oxygen was terminated, and the temperature was lowered from 1450 to 1300° C. at 5° C./minute. The temperature was kept at 1300° C. for 3 hours in an atmosphere into which an argon gas was introduced at a rate of 10 liters/minute per 0.1 m³ of the furnace capacity. Thereafter, a sintered body was left to cool.

The obtained sintered body was processed into a cylindrical shape having a diameter of 30 mm and a thickness of 40 mm. The sintered body had a density of 6.6 g/cm³ and a specific resistance of 1.1 mΩcm. The crystal particle diameter was 10 to 15 μm. The composition was substantially the same as the composition thus fed. The colors of the surface and the inside of the obtained sintered body were the same. The L* value was measured, and it was a considerably small value (50) as shown in Table 1a. This indicates that the amount of oxygen in the oxide evaporation material was considerably small.

Next, the film formation evaluation was performed as in Examples 1 to 4.

The result is also shown in Tables 1a to 1c above.

The oxide evaporation material of Comparative Example 3 had an L* value (50) substantially smaller than the specified range of the present invention (62 to 95), and is characterized in that the optimal oxygen mixed amount (35) during the film formation was substantially larger than those of the oxide evaporation materials of Examples 1 to 4. As to the film characteristics of the film with the optimal oxygen mixed amount, the transmittance was equivalent to those of Examples 1 to 4. However, the specific resistance was higher. This seems to be caused by the large difference in composition between the film and the evaporation material. Furthermore, the film of Comparative Example 3 had an adhesive force to the substrate weaker than those of Examples 1 to 4. This seems to be caused by a larger amount of oxygen introduced during the film formation. Such an oxide evaporation material greatly differs in composition from the film to be obtained, accordingly making it difficult to design the film composition. Moreover, since a larger amount of oxygen has to be introduced into the film-formation vacuum chamber, when the oxide evaporation material is used for the mass production of the films, the compositions and the characteristics of the films greatly vary from one another due to the influence of the change in the oxygen concentration in the vacuum chamber. In addition, the durability test was performed on the oxide evaporation material under the same conditions as those in Examples 1 to 4. It was found out that the oxide evaporation material had a crack generated after films are formed continuously (evaluated as "fracture"). If films were continuously formed using such an oxide evaporation material having a crack, problems occur such as a large variation in the film formation speed, hindering stable film formation.

Thus, it can be concluded that the oxide evaporation material of Comparative Example 3 is inappropriate for forming films in large quantities.

EXAMPLES 5 TO 8

Oxide sintered bodies (oxide evaporation materials) of Examples 5 to 8 were produced under exactly the same conditions as those of Examples 1 to 4 including the conditions for the oxygen-amount adjustment for the sintered bodies, except that the $In_2O_3$ and $CeO_2$ powders were blended in such a manner that the Ce/In atomic ratio was to be 0.051.

Specifically, the oxide evaporation material according to Example 5 was manufactured under the condition where the flow ratio (i.e., volume ratio) of oxygen gas/argon gas was "40/60." The oxide evaporation material according to Example 6 was manufactured under the condition where the volume ratio was "60/40." The oxide evaporation material according to Example 7 was manufactured under the condition that the volume ratio was "80/20." The oxide evaporation material according to Example 8 was manufactured under the condition that the volume ratio was "90/10."

Then, the density, specific resistance, crystal particle diameter, and composition of the obtained oxide sintered bodies (oxide evaporation materials) of Examples 5 to 8 were evaluated in the same way as above. Any of these parameters were equivalent to those of Examples 1 to 4. Moreover, the colors of the surface and the inside each of the obtained oxide sintered bodies were the same. Table 1a shows the measurement results of the L* value.

Next, the film formation evaluation was performed as in Examples 1 to 4.

The result is also shown in Tables 1a to 1c above.

In the film formation using the oxide evaporation materials of Examples 5 to 8 the optimal oxygen mixed amount to be introduced into the film-formation vacuum chamber so as to obtain a transparent conducting film having the lowest resistance and the highest transmittance was, as in Examples 1 to 4, considerably small. This is because each oxide evaporation material contained the optimal oxygen amount. Additionally, the film formed with the optimal oxygen mixed amount had the same composition as that of the oxide evaporation material, and exhibited not only considerably low specific resistance but also high transmittance in the visible to near-infrared region. Moreover, all the films were crystalline films of indium oxide with the bixbyite structure, and also had such a strong adhesive force to the substrate that the films can be used practically. Furthermore, the oxide evaporation materials of Examples 5 to 8 had no crack generated even when continuously used.

Such transparent conducting films can be said to be quite useful as a transparent electrode of solar cells.

COMPARATIVE EXAMPLES 4 AND 5

Oxide evaporation materials of Comparative Examples 4 and 5 were manufactured under the same conditions as those of Comparative Examples 1 and 2, except that the $In_2O_3$ and $CeO_2$ powders were blended in such a manner that the Ce/In atomic ratio was to be 0.051. Specifically, as to the condition for the oxygen-amount adjustment for the sintered bodies, the $O_2$/Ar flow ratio was 30/70 in Comparative Example 4, and 100/0 in Comparative Example 5. The density, specific resistance, crystal particle diameter, and composition of the obtained sintered bodies were evaluated in the same way as above. Any of these parameters were equivalent to those of Examples 5 to 8. The colors of the surface and the inside each of the obtained oxide sintered bodies were the same. The L* value was measured, and shown in Table 1a.

Next, the film formation evaluation was performed as in Examples 1 to 4.

The result is also shown in Tables 1a to 1c above.

The oxide evaporation material of Comparative Example 4 had an L* value (57) smaller than the specified range of the present invention, and is characterized in that the optimal oxygen mixed amount during the film formation was larger than those of the oxide evaporation materials of Examples 5 to 8. As to the film characteristics of the film with the optimal oxygen mixed amount, the transmittance was equivalent to those of Examples 5 to 8. However, the specific resistance was slightly higher. This seems to be caused by the large difference in composition between the film that contains an excessive amount of cerium and the evaporation material. Furthermore, the film of Comparative Example 4 had an adhesive force to the substrate weaker than those of Examples 5 to 8. The cause of both of such a large composition difference and weaker adhesive force is that a larger amount of oxygen was introduced during the film formation. Such an oxide evaporation material greatly differs in composition from the film to be obtained, accordingly making it difficult to design the film composition. Moreover, since a larger amount of oxygen has to be introduced into the film-formation vacuum chamber, when the oxide evaporation material is used for the mass production of the films, the compositions and the characteristics of the films tend to be influenced noticeably from the change in the oxygen concentration in the vacuum chamber. Thus, it can be concluded that the oxide evaporation material of Comparative Example 4 is also inappropriate for forming films in large quantities.

Meanwhile, Comparative Example 5 is an example of the oxide evaporation material having an L* value (97) larger than the specified range of the present invention. The optimal oxygen mixed amount during the film formation was 0%, but the specific resistance of the film higher than those of Examples 5 to 8. This seems to be caused by the fact that too large an amount of oxygen was supplied from the oxide evaporation material to the film, which makes the oxygen content in the film large, hindering the introduction of the optimal amount of oxygen deficiency. Thus, it can be concluded that, even if such an oxide evaporation material is used for film formation, the film cannot exhibit a high conductivity that the composition of the oxide evaporation material originally has.

COMPARATIVE EXAMPLE 6

An oxide evaporation material of Comparative Example 6 was manufactured under the same conditions as those of Comparative Example 3, except that the $In_2O_3$ and $CeO_2$ powders were blended in such a manner that the Ce/In atomic ratio was to be 0.051. The density, specific resistance, crystal particle diameter, and composition of the obtained sintered body were evaluated in the same way as above. Any of these parameters were equivalent to those of Comparative Example 3. The colors of the surface and the inside of the obtained oxide sintered body were the same. The L* value was measured, and shown in Table 1a.

Next, the film formation evaluation was performed as in Examples 1 to 4.

The result is also shown in Tables 1a to 1c above.

The oxide evaporation material of Comparative Example 6 also had an L* value (49) substantially smaller than the specified range of the present invention, and is characterized in that the optimal oxygen mixed amount (42) during the film formation was substantially larger than those of the oxide evaporation materials of Examples 5 to 8. As to the film characteristics of the film with the optimal oxygen mixed amount, the transmittance was equivalent to those of Examples 5 to 8. However, the specific resistance was higher. This seems to be caused by the large difference in composition between the film and the evaporation material. Furthermore, the film of Comparative Example 6 had an adhesive force to the substrate weaker than those of Examples 5 to 8. This seems to be caused by a larger amount of oxygen introduced during the film formation. Such an oxide evaporation material greatly differs in composition from the film to be obtained, accordingly making it difficult to design the film composition. Moreover, since a larger amount of oxygen has to be introduced into the film-formation vacuum chamber, when the oxide evaporation material is used for the mass production of the films, the compositions and the characteristics of the films greatly vary from one another due to the influence of the change in the oxygen concentration in the vacuum chamber. In addition, the durability test was performed on the oxide evaporation material under the same conditions as those in Examples 1 to 4. It was found out that the oxide evaporation material had a crack generated after films are formed continuously (evaluated as "fracture"). If films were continuously formed using such an oxide evaporation material having a crack, problems occur such as a large variation in the film formation speed, hindering stable film formation.

Thus, it can be concluded that the oxide evaporation material of Comparative Example 6 is also inappropriate for forming films in large quantities.

EXAMPLES 9 TO 15

Oxide sintered bodies (oxide evaporation materials) of Examples 9 to 15 were produced under the same conditions as those of Example 2 (that include the condition for the flow ratio of oxygen gas/argon gas of "60/40"), except that the $In_2O_3$ and $CeO_2$ powders were blended in such a manner that the Ce/In atomic ratio was: 0.001 (Example 9), 0.002 (Example 10), 0.004 (Example 11), 0.061 (Example 12), 0.070 (Example 13), 0.090 (Example 14), and 0.110 (Example 15).

Then, the density, specific resistance, crystal particle diameter, and composition of the obtained oxide sintered bodies (oxide evaporation materials) of Examples 9 to 15 were evaluated in the same way as above. Any of these parameters were equivalent to those of Example 2. Moreover, the colors of the surface and the inside each of the obtained oxide sintered bodies were the same. Table 1a shows the measurement results of the L* value.

Next, the film formation evaluation was performed as in Examples 1 to 4.

The result is also shown in Tables 1a to 1c above.

In the film formation using the oxide evaporation materials of Examples 9 to 15 so as to obtain a transparent conducting film having the lowest resistance and the highest transmittance the optimal oxygen mixed amount to be introduced into the film-formation vacuum chamber was, as in Examples 1 to 4, considerably small. This is because each oxide evaporation material contained the optimal oxygen amount. Additionally, the film formed with the optimal oxygen mixed amount had the same composition as that of the oxide evaporation material, and exhibited not only considerably low specific resistance but also high transmittance in the visible to near-infrared region. Moreover, all the films were crystalline films of indium oxide with the bixbyite structure, and also had such a strong adhesive force to the substrate that the films can be used practically. In addition, the durability test was performed on the oxide evaporation materials under the same conditions as those in Examples 1 to 4. It was found out that the oxide evaporation materials of Examples 9 to 15 had no crack generated even when continuously used.

Such transparent conducting films can be said to be quite useful as a transparent electrode of solar cells.

EXAMPLES 16 TO 20

In addition to an $In_2O_3$ powder and a $CeO_2$ powder, a $WO_3$ powder (average particle diameter of 1 μm) was used as a raw-material powder to produce an oxide sintered body (oxide evaporation material) of indium oxide containing cerium and tungsten.

Oxide sintered bodies (oxide evaporation materials) of Examples 16 to 20 were produced under the same conditions as those of Example 2 (that include the condition for the flow ratio of oxygen gas/argon gas of "60/40"), except that the compositions were changed in such a manner that the blending ratios of the raw-material powders (Ce/In atomic ratio, W/In atomic ratio) were, as shown in Table 2a: Example 16 (0.004, 0.001), Example 17 (0.004, 0.006), Example 18 (0.008, 0.006), Example 19 (0.008, 0.015), and Example 20 (0.051, 0.020).

TABLE 2a

| Example: | A | A' | B | L* value of oxide evaporation material | Optimal oxygen mixed amount |
|---|---|---|---|---|---|
| 16 | 0.004 | 0.001 | 60/40 | 84 | 7 |
| 17 | 0.004 | 0.006 | 60/40 | 85 | 7 |
| 18 | 0.008 | 0.006 | 60/40 | 85 | 6 |

TABLE 2a-continued

| Example: | A | A' | B | L* value of oxide evaporation material | Optimal oxygen mixed amount |
|---|---|---|---|---|---|
| 19 | 0.008 | 0.015 | 60/40 | 84 | 6 |
| 20 | 0.051 | 0.020 | 60/40 | 85 | 5 |

*(Remarks)
A: Ce/In atomic ratio of oxide evaporation material,
A': W/In atomic ratio of oxide evaporation material,
B: $O_2$/Ar flow ratio in oxygen-amount adjustment for sintered body TABLE 2b

| | Film characteristics with optimal oxygen mixed amount | | | | | |
|---|---|---|---|---|---|---|
| | Specific | Carrier | Hole | Transmittance of film itself (%) | | |
| Example: | resistance ($\mu\Omega$cm) | concentration ($cm^{-3}$) | mobility ($cm^2$/Vs) | Visible region | Near infrared region | Film crystalline |
| 16 | 300 | $2.39 \times 10^{20}$ | 87 | 91 | 84 | crystalline film |
| 17 | 290 | $2.42 \times 10^{20}$ | 89 | 91 | 83 | crystalline film |
| 18 | 190 | $3.50 \times 10^{20}$ | 94 | 91 | 82 | crystalline film |
| 19 | 180 | $3.95 \times 10^{20}$ | 88 | 90 | 79 | crystalline film |
| 20 | 370 | $2.38 \times 10^{20}$ | 71 | 90 | 83 | crystalline film |

TABLE 2c

| | Film characteristics with optimal oxygen mixed amount | | | |
|---|---|---|---|---|
| Example: | Ce/In atomic ratio of film | W/In atomic ratio of film | Film adhesive force to substrate | Fracture on oxide evaporation material |
| 16 | 0.004 | 0.001 | strong | no fracture |
| 17 | 0.004 | 0.006 | strong | no fracture |
| 18 | 0.008 | 0.006 | strong | no fracture |
| 19 | 0.008 | 0.015 | strong | no fracture |
| 20 | 0.051 | 0.020 | strong | no fracture |

Then, the density, specific resistance, crystal particle diameter, and composition of the obtained oxide sintered bodies (oxide evaporation materials) of Examples 16 to 20 were evaluated in the same way as above. Any of these parameters were equivalent to those of Example 2. Moreover, the colors of the surface and the inside each of the obtained oxide sintered bodies were the same. Table 2a shows the measurement results of the L* value.

Next, the film formation evaluation was performed as in Examples 1 to 4.

The result is also shown in Tables 2a to 2c above.

In the film formation using the oxide evaporation materials of Examples 16 to 20 so as to obtain a transparent conducting film having the lowest resistance and the highest transmittance the optimal oxygen mixed amount to be introduced into the film-formation vacuum chamber was, as in Examples 1 to 4, considerably small. This is because each oxide evaporation material contained the optimal oxygen amount. Additionally, the film formed with the optimal oxygen mixed amount had the same composition as that of the oxide evaporation material, and exhibited not only considerably low specific resistance but also high transmittance in the visible to near-infrared region. Moreover, all the films were crystalline films of indium oxide with the bixbyite structure, and also had such a strong adhesive force to the substrate that the films can be used practically. In addition, the durability test was performed on the oxide evaporation materials under the same conditions as those in Examples 1 to 4. It was found out that the oxide evaporation materials of Examples 16 to 20 had no crack generated even when continuously used.

Such transparent conducting films can also be said to be quite useful as a transparent electrode of solar cells.

EXAMPLES 21 TO 25

In addition to an $In_2O_3$ powder and a $CeO_2$ powder, a $MoO_3$ powder (average particle diameter of 1 µm) was used as a raw-material powder to produce an oxide sintered body (oxide evaporation material) of indium oxide containing cerium and molybdenum.

Oxide sintered bodies (oxide evaporation materials) of Examples 21 to 25 were produced under the same conditions as those of Example 2 (that include the condition for the flow ratio of oxygen gas/argon gas of "60/40"), except that the compositions were changed in such a manner that the blending ratios of the raw-material powders (Ce/In atomic ratio, Mo/In atomic ratio) were, as shown in Table 3a: Example 21 (0.004, 0.001), Example 22 (0.004, 0.009), Example 23 (0.008, 0.009), Example 24 (0.008, 0.030), and Example 25 (0.051, 0.050).

TABLE 3a

| Example: | A | A" | B | L* value of oxide evaporation material | Optimal oxygen mixed amount |
|---|---|---|---|---|---|
| 21 | 0.004 | 0.001 | 60/40 | 73 | 6 |
| 22 | 0.004 | 0.009 | 60/40 | 70 | 7 |
| 23 | 0.008 | 0.009 | 60/40 | 68 | 7 |
| 24 | 0.008 | 0.030 | 60/40 | 65 | 7 |
| 25 | 0.051 | 0.050 | 60/40 | 62 | 9 |

*(Remarks)
A: Ce/In atomic ratio of oxide evaporation material,
A": Mo/In atomic ratio of oxide evaporation material,
B: $O_2$/Ar flow ratio in oxygen-amount adjustment for sintered body

TABLE 3B

Film characteristics with optimal oxygen mixed amount

| Example: | Specific resistance ($\mu\Omega$cm) | Carrier concentration ($cm^{-3}$) | Hole mobility ($cm^2$/Vs) | Transmittance of film itself (%) Visible region | Transmittance of film itself (%) Near infrared region | Film crystalline |
|---|---|---|---|---|---|---|
| 21 | 300 | $2.57 \times 10^{20}$ | 81 | 91 | 81 | crystalline film |
| 22 | 270 | $2.97 \times 10^{20}$ | 78 | 91 | 81 | crystalline film |
| 23 | 180 | $3.82 \times 10^{20}$ | 91 | 91 | 79 | crystalline film |
| 24 | 160 | $4.65 \times 10^{20}$ | 84 | 91 | 76 | crystalline film |
| 25 | 280 | $3.14 \times 10^{20}$ | 71 | 90 | 84 | crystalline film |

TABLE 3c

Film characteristics with optimal oxygen mixed amount

| Example: | Ce/In atomic ratio of film | Mo/In atomic ratio of film | Film adhesive force to substrate | Fracture on oxide evaporation material |
|---|---|---|---|---|
| 21 | 0.004 | 0.001 | strong | no fracture |
| 22 | 0.004 | 0.006 | strong | no fracture |
| 23 | 0.008 | 0.006 | strong | no fracture |
| 24 | 0.008 | 0.030 | strong | no fracture |
| 25 | 0.051 | 0.050 | strong | no fracture |

Then, the density, specific resistance, crystal particle diameter, and composition of the obtained oxide sintered bodies (oxide evaporation materials) of Examples 21 to 25 were evaluated in the same way as above. Any of these parameters were equivalent to those of Example 2. Moreover, the colors of the surface and the inside each of the obtained oxide sintered bodies were the same. Table 3a shows the measurement results of the L* value.

Next, the film formation evaluation was performed as in Examples 1 to 4.

The result is also shown in Tables 3a to 3c above.

In the film formation using the oxide evaporation materials of Examples 21 to 25 so as to obtain a transparent conducting film having the lowest resistance and the highest transmittance the optimal oxygen mixed amount to be introduced into the film-formation vacuum chamber was, as in Examples 1 to 4, considerably small. This is because each oxide evaporation material contained the optimal oxygen amount. Additionally, the film formed with the optimal oxygen mixed amount had the same composition as that of the oxide evaporation material, and exhibited not only considerably low specific resistance but also high transmittance in the visible to near-infrared region. Moreover, all the films were crystalline films of indium oxide with the bixbyite structure, and also had such a strong adhesive force to the substrate that the films can be used practically. In addition, the durability test was performed on the oxide evaporation materials under the same conditions as those in Examples 1 to 4. It was found out that the oxide evaporation materials of Examples 21 to 25 had no crack generated even when continuously used.

Such transparent conducting films can be said to be quite useful as a transparent electrode of solar cells.

COMPARATIVE EXAMPLE 7

Next, a sintered body of indium oxide containing cerium was produced according to the production technique for a sintered body of a sputtering target proposed in Patent Document 2.

An $In_2O_3$ powder having an average particle diameter of approximately 2 μm and the $CeO_2$ powder having an average particle diameter of approximately 2 μm were used as raw-material powders. In addition, a $SnO_2$ powder having an average particle diameter of approximately 2 μm and a $TiO_2$ powder having an average particle diameter of approximately 2 μm were used as sintering aids. The $In_2O_3$ and $CeO_2$ powders were blended in such a manner that the Ce/In atomic ratio was to be 0.008. Furthermore, the $SnO_2$ and $Tio_2$ powders were blended in such a manner that a Sn/In atomic ratio was to be 0.01, and that a Ti/In atomic ratio was to be 0.005. These mixtures were put in a resin pot, and mixed with a wet ball mill. At this time, hard $ZrO_2$ balls were used, and the mixing time was 24 hours. After the mixing, the slurry was taken out, filtrated, dried, and then granulated. The granulated powder thus obtained was subjected to cold isostatic pressing at 500 Kgf/$cm^2$. Thus, a green compact having a density of 3.5 g/$cm^3$ was obtained.

The obtained green compact was put in a sintering furnace into which oxygen was introduced at a rate of 5 liters/minute per 0.1 $m^3$ of the furnace capacity to create an atmosphere. The green compact was sintered at 1450° C. for 40 hours. In this event, the temperature was increased to 1000° C. at 1° C./minute, and from 1000 to 1450° C. at 2° C./minute. Then, the introduction of oxygen was terminated, and the temperature was lowered from 1450 to 1300° C. at 5° C./minute. The temperature of 1300° C. was kept for 3 hours in an atmosphere into which an argon gas was introduced at a rate of 10 liters/minute per 0.1 m$^3$ of the furnace capacity. Thereafter, a sintered body was left to cool.

The obtained sintered body was processed into a cylindrical shape having a diameter of 30 mm and a thickness of 40 mm. The sintered body had a density of 6.7 g/cm$^3$ and a specific resistance of 0.9 mΩcm. The crystal particle diameter was 10 to 13 μm. The composition was substantially the same as the composition thus fed. The colors of the surface and the inside of the obtained sintered body were the same. The L* value was measured, and it was a considerably small value (45). This indicates that the amount of oxygen in the oxide evaporation material was considerably small.

Using the oxide evaporation material (oxide sintered body) of Comparative Example 7 thus manufactured, the same film formation evaluation was performed as in Examples 1 to 4.

As a result, the film formation speed changed rapidly, and the film was not formed stably. From the observation of the oxide evaporation material after the film formation test, it was found out that a solid material was attached to the surface of the oxide evaporation material. The analysis on this solid material revealed that the solid material was concentrated mass of titanium oxide. Titanium oxide was increased in amount and remained on the surface when the film formation was continued presumably because the high vapor pressure of titanium oxide makes it difficult to evaporate. Such a titanium oxide mass covering the surface of the oxide evaporation material hinders stable film formation by vacuum deposition.

From the above, even if a sintered body of indium oxide containing cerium is produced by adopting the production technique for a sintered body of a sputtering target proposed in Patent Document 2, the sintered body cannot be utilized as an oxide evaporation material that can be stably employed in vacuum deposition methods.

COMPARATIVE EXAMPLE 8

Next, an ITO oxide evaporation material proposed in Patent Document 1 was manufactured, and the same evaluation was performed thereon.

Specifically, a tin oxide powder having an average particle diameter of 1 μm was blended in an indium oxide powder having an average particle diameter of 0.1 μm in such a manner that the tin oxide composition was 10% by weight. A vinyl acetate binder was added by 2% by weight to the mixture, which was mixed in a wet ball mill for 16 hours, dried, and ground. Thereby, a granulated powder was obtained. Subsequently, the granulated powder was subjected to cold isostatic pressing at 500 Kgf/cm$^2$. Thus, a cylindrical green compact was obtained. The green compact was sintered in the air. In the sintering process, the temperature was increased from room temperature to 600° C. in 10 hours, and continued to increase up to 1450° C. in 4 hours and 40 minutes. Then, the temperature was kept at 1450° C. for another 10 hours. Thus, a sintered body was obtained.

The obtained sintered body was processed into a cylindrical shape having a diameter of 30 mm and a thickness of 40 mm. Thus, an ITO oxide evaporation material was made. The sintered body had a density of 6.9 g/cm$^3$ and a specific resistance of 1.2 mΩcm. The crystal particle diameter was 12 to 16 μm. The composition was substantially the same as the composition thus fed.

The colors of the surface and the inside of the sintered body were the same. The L* value was measured, and it was a considerably small value of 49. This indicates that the amount of oxygen in the oxide evaporation material was considerably small.

Using the oxide evaporation material (oxide sintered body) of Comparative Example 8 thus manufactured, the same film formation evaluation was performed as in Examples 1 to 4.

As a result, the optimal oxygen mixed amount during the film formation was larger than that of the film obtained by using the oxide evaporation material of the present invention. As to the film characteristics with the optimal oxygen mixed amount, both the transmittance in the visible region and the specific resistance were equivalent to those of the film obtained by using oxide evaporation material of the present invention; however, the transmittance in the near-infrared region was considerably low. The reason the transmittance in the near-infrared region was low is that a large amount of electron carriers are generated in the film. Thus, it can be concluded that the film of Comparison Example 8 is not a useful transparent conducting film as a transparent electrode for solar cells. Furthermore, the film of Comparative Example 8 had a weaker adhesive force to the substrate than the film of the present invention has. This is because a large amount of oxygen was introduced for the film formation. Moreover, since a larger amount of oxygen has to be introduced into the film-formation vacuum chamber for the film formation, when films are formed in large quantities, the compositions and the characteristics of the films tend to noticeably vary from one another due to the influence of the change in the oxygen concentration in the vacuum chamber. Thus, it can be concluded that the oxide evaporation material of Comparative Example 8 is inappropriate for forming films in large quantities.

POSSIBILITY OF INDUSTRIAL APPLICATION

The use of the oxide evaporation material according to the present invention enables formation by vacuum deposition methods of a transparent conducting film exhibiting a high conductivity and a high transmittance not only in the visible region but also in the near-infrared region. Accordingly, it has a possibility of industrial application that it is utilized as an oxide evaporation material for forming a transparent electrode of various solar cells.

What is claimed is:

1. An oxide evaporation material comprising a sintered body containing: indium oxide as a main component thereof; and cerium, wherein a cerium content is 0.001 to 0.110 in a Ce/In atomic ratio, and an L* value in a CIE 1976 color space is 62 to 95.

2. The oxide evaporation material according to claim 1, wherein the cerium content is 0.004 to 0.051 in the Ce/In atomic ratio.

3. The oxide evaporation material according to claim 2, further comprising tungsten with a W/In atomic ratio of 0.001 to 0.020.

4. The oxide evaporation material according to claim 2, further comprising molybdenum with a Mo/In atomic ratio of 0.001 to 0.050.

* * * * *